United States Patent [19]

Saito

[11] Patent Number: 5,596,227
[45] Date of Patent: Jan. 21, 1997

[54] BALL GRID ARRAY TYPE SEMICONDUCTOR DEVICE

[75] Inventor: Hiroshi Saito, Hamamatsu, Japan

[73] Assignee: Yamaha Corporation, Japan

[21] Appl. No.: 522,550

[22] Filed: Sep. 1, 1995

[30] Foreign Application Priority Data

Sep. 1, 1994 [JP] Japan .................................. 6-232414

[51] Int. Cl.⁶ .................................................. H01L 23/12
[52] U.S. Cl. ........................ 257/701; 257/702; 257/774; 257/787
[58] Field of Search .................................. 257/700, 787, 257/701, 702, 774

[56] References Cited

U.S. PATENT DOCUMENTS 5,285,352  2/1994  Pastore et al. ........................... 257/738
5,394,298  2/1995  Sagisaka .................................. 257/796

FOREIGN PATENT DOCUMENTS 4-76945  3/1992  Japan .
4-215461  8/1992  Japan .

OTHER PUBLICATIONS

Nikkei Electronics 1994 Feb. 14 issue—pp. 60–73.
Nikkei Electronics 1994 Feb. 28 issue—pp. 111–117.

*Primary Examiner*—Sara W. Crane
*Assistant Examiner*—Roy Potter

[57] ABSTRACT

A mother board has wiring patterns formed on the front and rear surfaces thereof. A solder ball is formed on an island at the end of each wiring pattern on the rear surface. Vias are formed in the mother board, surrounding an LSI mount area of the board. An LSI chip mounted on the mother board is sealed by a front surface sealing resin layer. A rear surface sealing resin layer having substantially the same size and thickness as those of the front surface sealing resin is molded on the rear surface of the mother board at the position registered to the front surface sealing resin layer. The front and rear surface sealing resin layers are integrally formed through the vias. Resin layers in the vias function as anchors for integrating the upper and lower sealing resin layers. Semiconductor devices of a resin molded type are provided which can improve reliability.

16 Claims, 7 Drawing Sheets

BALL GRID ARRAY TYPE SEMICONDUCTOR DEVICE

BACKGROUND OF THE INVENTION a) Field of the Invention

The present invention relates to a semiconductor device having a resin molded LSI chip mounted on a circuit board with wiring patterns.

b) Description of the Related Art

As one of LSI packages, there is a chip carrier package suitable for a device having multiple connection pins. For example, an LSI chip is mounted on the front surface of a circuit board. The circuit board has wiring patterns on the front surface thereof and associated wiring patterns and solder balls on the rear surface thereof, and is resin-molded for hermetically sealing the LSI chip. This type of package, called a Ball Grid Array (BOA) package, has been proposed in U.S. Pat. No. 5,241,133, which is incorporated herein by reference.

With this BGA package, an LSI ship is mounted on one surface of a circuit board and hermetically sealed by resin. This type of package has the following problems.

First, a circuit board warps because of compression of molding. This warp may be considered resulting mainly from a difference between thermal expansion coefficients between the circuit board and sealing resin layer. As the size of a circuit board becomes large, the co-planarity of a number of solder balls becomes poor and packaging defects are likely to occur.

Second, moisture content is likely to permeate into the device from lower peripheries of a region of a circuit board (particularly plastic circuit board) for mounting an LSI chip or from through holes formed in the board. Device defects caused by moisture is therefore likely to occur.

Third, if moisture content permeates into the package, a process of drying a package at a high temperature is required during packaging processes. This high temperature process easily causes peeling-off of the sealing resin layer and the circuit board.

SUMMARY OF THE INVENTION

It is an object of the present invention to provide a semiconductor device of a resin molded type capable of improving device reliability.

According to one aspect of the present invention, there is provided a semiconductor device comprising: a board with a plurality of wiring patterns; an LSI chip mounted on a front surface of the board; a front surface sealing resin layer for sealing the front surface of the board mounting the LSI chip; and a rear surface sealing resin layer for sealing a rear surface of the board at a position registered to the front surface sealing resin layer, the rear surface sealing resin layer having substantially the same size and thickness as those of the front surface sealing resin layer.

Preferably, vias or through holes are formed in the board near at a mount area of the LSI chip, the front surface sealing resin layer and the rear surface sealing resin layer being integrated or merged through the vias.

According to another aspect of the present invention, there is provided a semiconductor device comprising: a board with a plurality of wiring patterns, the board having an LSI chip mount hole; a heat sink disposed on a rear surface of the board and closing the LSI chip mount hole; an LSI chip mounted on the heat sink in the LSI chip mount hole of the board; a front surface sealing resin layer for sealing a front surface of the board including the mount hole and the LSI chip mounted on the heat sink; and a rear surface sealing resin layer for sealing the rear surface of the board at an area where the heat sink is disposed.

Preferable, vias are formed in the heat sink near at a mount area of the LSI chip, the front surface sealing resin layer and the rear surface sealing resin layer being integrated or merged through the vias.

The LSI chip mounted on the board is sealed by the front and rear surface sealing resin layers. Therefore, a warp of the circuit board to be caused by compression off molding of resin is not likely to occur. Furthermore, the LSI chip mount area is sealed by the front and rear surface sealing resin layers. Therefore, moisture content is hard to permeate into the device. A dry process during packaging processes can be simplified or omitted if possible. The board and sealing resin layers are prevented from being peeled off from each other.

Still further, since the rear surface sealing resin layer is formed on the bottom of the LSI chip mount area, even if the package is placed in a flat area, the solder balls are spaced from the flat area. Therefore, the bottoms of solder balls are not damaged or stained, and possible electrostatic breakages of the device can be avoided. Packages can be stacked or handled with less care.

Since a warp of a circuit board and moisture permeation can be avoided, a semiconductor device of high reliability can be manufactured.

DETAILED DESCRIPTION OF THE PREFERRED EMBODIMENTS

Embodiments of the present invention will be described with reference to the accompanying drawings.

Figure 1:
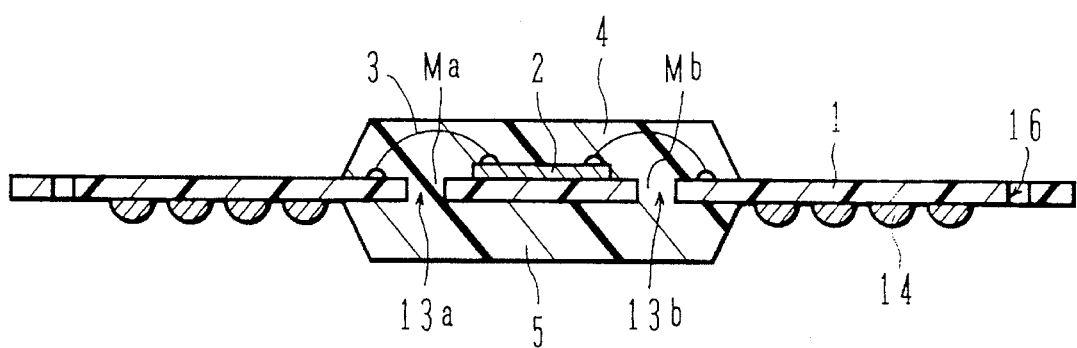
FIG. 1 is a cross sectional view of a semiconductor device according to an embodiment of the invention.
Figure 2A:
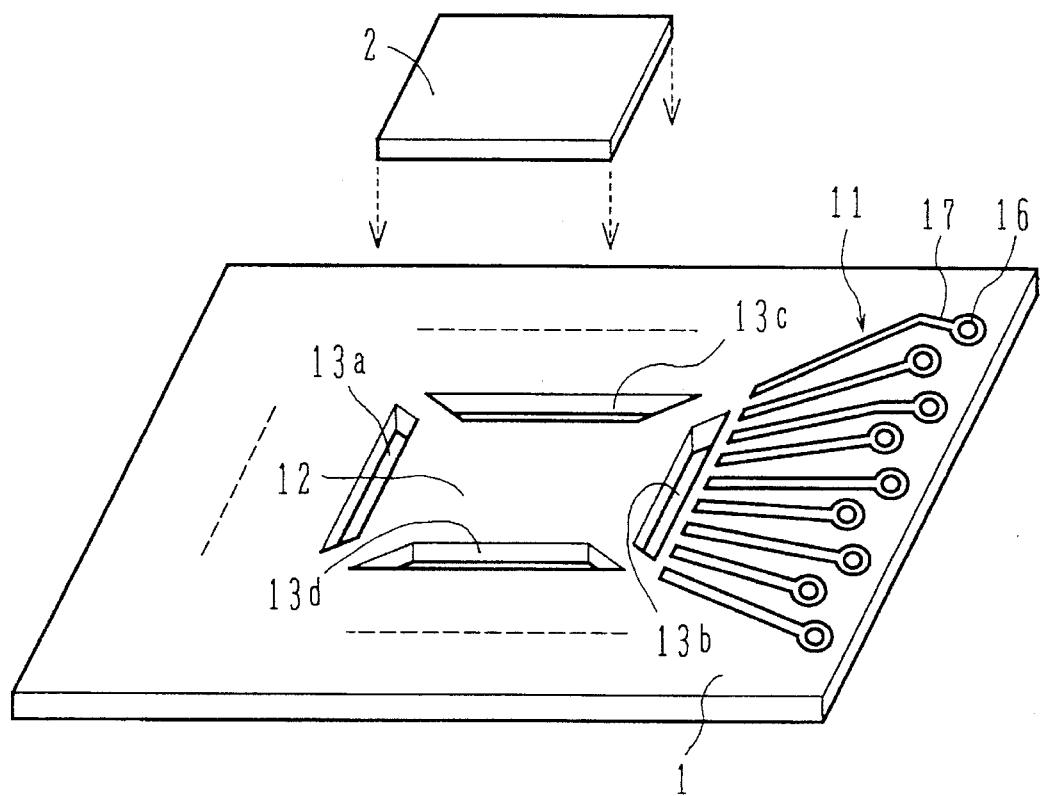
FIGS. 2A to 2D are perspective views and cross sectional views illustrating a chip mount structure of the semiconductor device shown in FIG. 1.
Figure 2B:
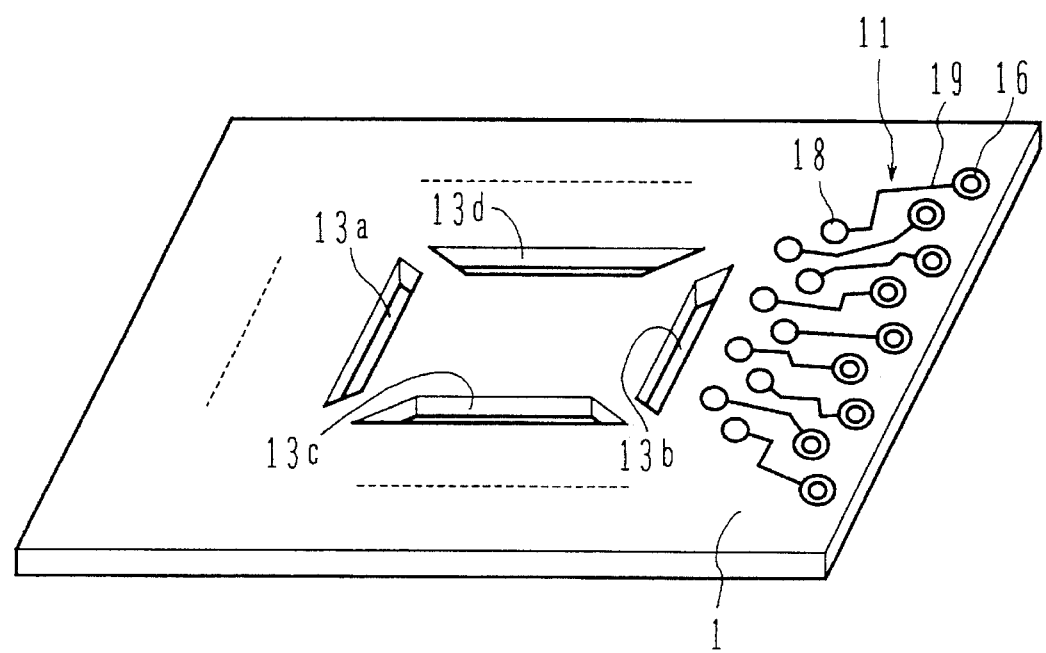

FIG. 1 is a cross sectional view of a semiconductor device according to an embodiment of this invention. FIGS. 2A and 2B are front and rear perspective views of a circuit board before an LSI chip is mounted thereon, A mother board 1 has wiring patterns 11 already printed thereon. Through holes 16 such as shown in FIG. 1 are formed in the mother board 1 at its peripheral area. Each wiring pattern 17 of the patterns 11 shown in FIG. 2A formed on the front surface of the mother board 1 is electrically connected to a corresponding wiring pattern 19 of the patterns 11 shown in FIG. 2B formed on the rear surface of the mother board 1, via a corresponding one through hole 16. At the end of each wiring pattern 19 formed on the rear surface of the mother board 1, an island 18 of a copper pattern is formed as shown in FIG. 2B, and a solder ball 14 is formed on this island 18 as shown in FIG. 1. Slit vias 13a to 18d are formed through the mother board 1, surrounding an LSI mount area 12 of the board 1.

Figure 2C:
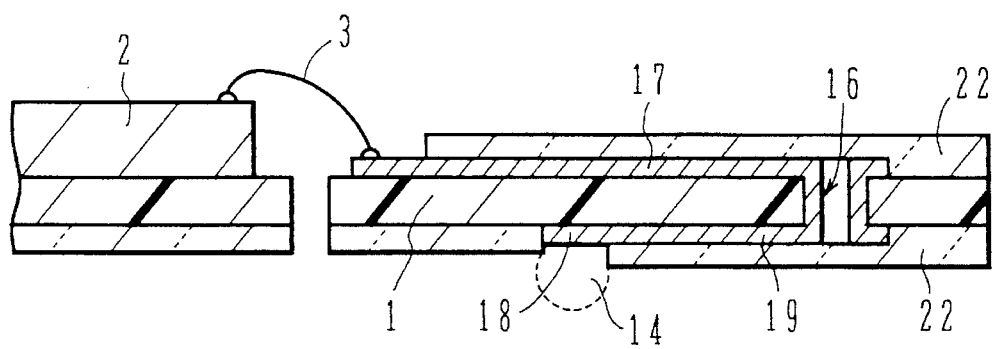

As shown in FIG. 2C, for the electrical connection of an LSI chip 2 mounted on the mother board 1, each terminal or bonding pad of the LSI chip is connected to the end of each wiring pattern 17 formed on the front surface of the mother board 1, for example, by a bonding wire 3.

As shown in FIG. 1, the terminal (bonding pad) of the chip 2 is electrically connected to the solder ball 14 (or the island 18) via the bonding wire 3, wiring pattern 17 formed on the front surface, through hole 16, and wiring pattern 19 formed on the rear surface. A resist layer 22 for forming solder balls 14 is formed on the rear surface, exposing the islands 18. The mounted LSI chip 2 is sealed by a front surface sealing resin layer 4. A rear surface sealing resin layer 5 is molded on the rear surface of the mother board 1 at the registered position corresponding to the front surface sealing resin layer 4.

Figure 2D:
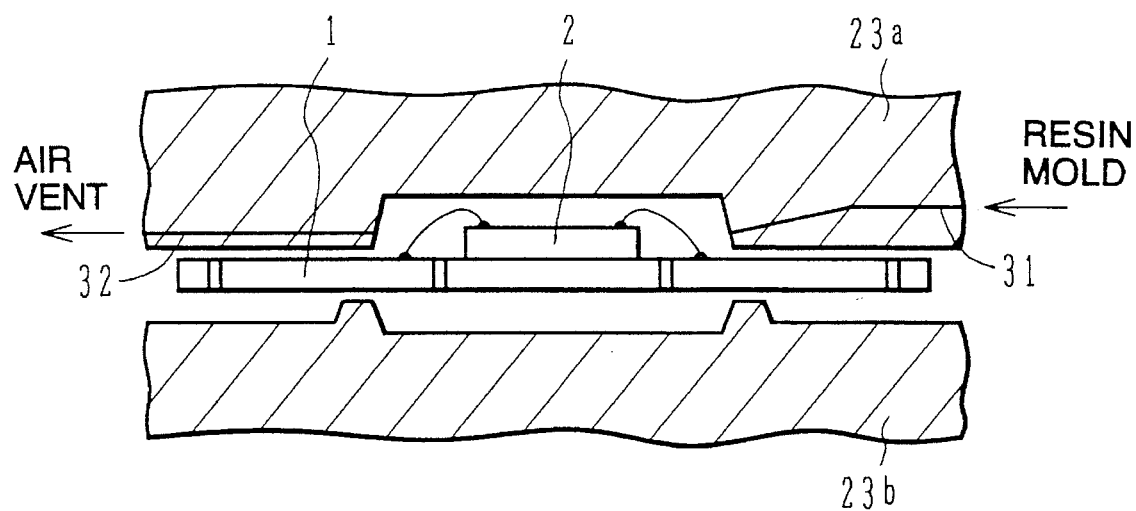

FIG. 2D illustrates a resin molding process. A mother board 1 having an LSI chip 2 mounted thereon is placed between an upper mold 23a and a lower mold 23b. Resin, such as epoxy resin, is injected from a resin injection gate 31, and air is expelled from an air bent 32. The sizes and thicknesses of the front and rear surface sealing resin layers 4 and 5 are substantially the same. The term "substantially the same" means practical equivalence from the viewpoint of applying stress to the mother board. For example, ten percent differences in stress and/or dimension are included in the concept of "substantially the same". The front and rear surface sealing resin layers 4 and 5 are integrally or mergedly formed through the vias 13a to 13d. Resin layers Ma and Mb in the vias 13a to 13d function as anchors for integrating the upper and lower sealing resin layers 4 and 5.

Provision of the front and rear surface sealing resin layers 4 and 5 having substantially the same thickness balances stresses in the mother board 1 at the chip mount area and in the resin layers 4 and 5. Warp of the mother board 1 can therefore be prevented reliably. Also, moisture content can be prevented from permeating into the LSI chip mount area. Peeling-off of resin can also be eliminated reliably by a combination of the effect of preventing permeation of moisture content and the integration effect of the front and rear surface sealing resin layers 4 and 5 through the resin layers M in the vias 13a to 13d.

Figure 3A:
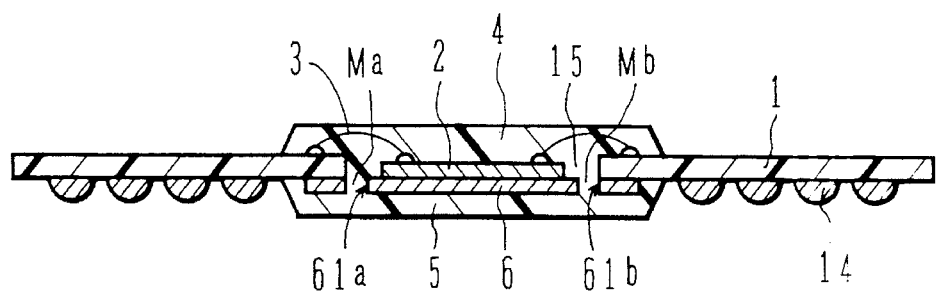
FIGS. 3A to 3C are a cross sectional view and perspective views of a semiconductor device according to another embodiment of the invention.
Figure 3B:
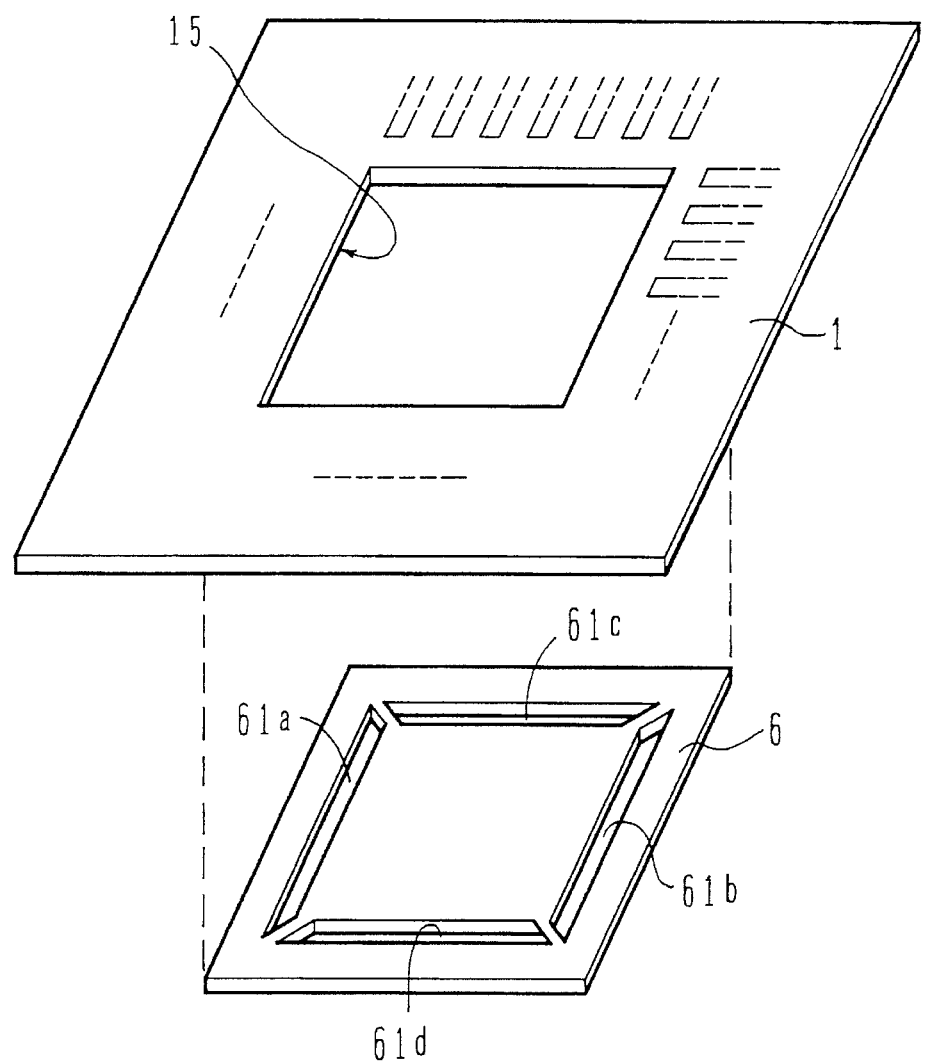
Figure 3C:
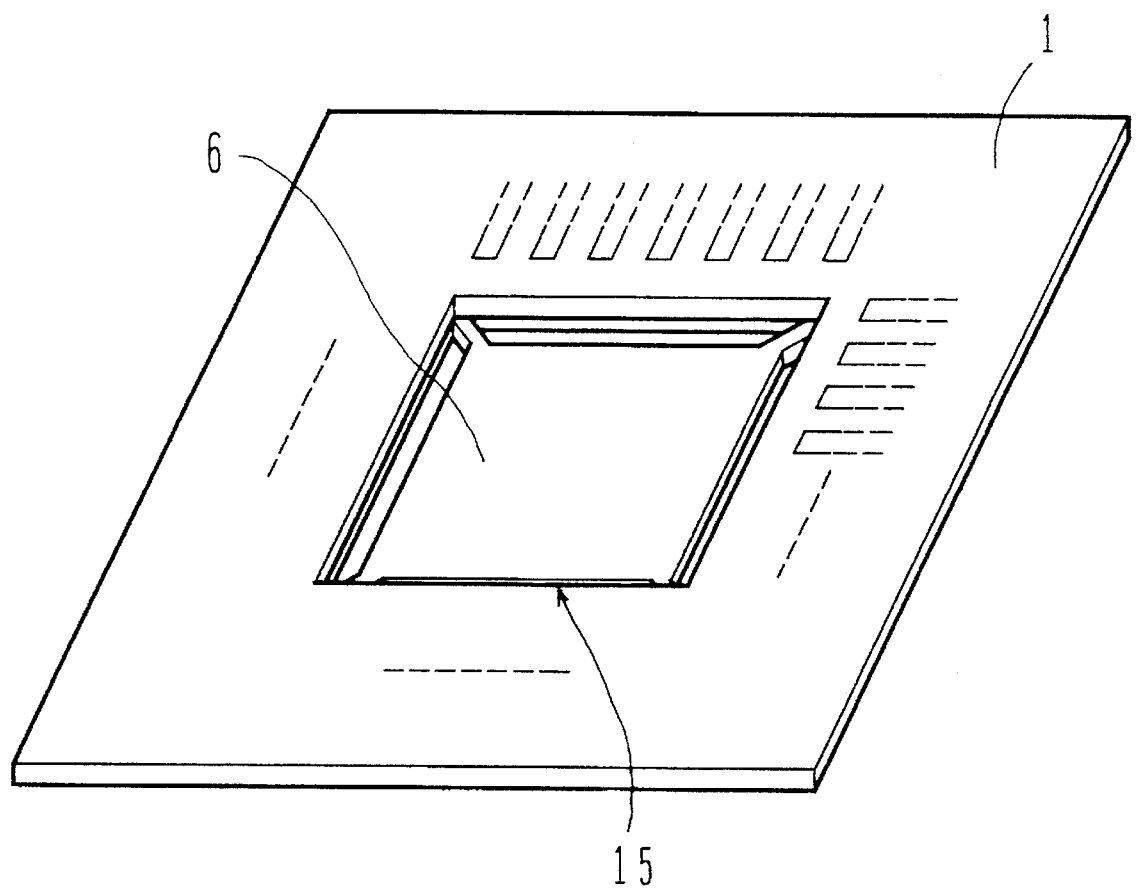

FIGS. 3A to 3C illustrate another embodiment of the invention. Like elements to those of the embodiment shown in FIGS. 1 to 2D are represented by identical reference numerals, and the detailed description thereof is omitted.

In this embodiment, a heat sink 6 is provided in addition to a mother board 1. The heat sink 6 is made of, for example, ceramic or metal having a high thermal conductivity. The mother board 1 has an LSI chip mount hole 15 previously formed therein. FIG. 3B illustrates the mother board 1 and heat sink 6 before they are assembled. As shown in FIG. 3C, the heat sink 6 is disposed on the rear surface of the mother board 1, closing the LSI chip mount hole 15. The heat sink 6 is preferably fixedly adhered to the mother board 1, for example by an adhesive. An LSI chip 2 is mounted on the surface of the heat sink 6.

The heat sink 6 has vias 61a to 61d previously formed therein near at its LSI chip mount area. Similar the first embodiment, a front sealing resin layer 4 and a corresponding rear surface sealing resin layer 5 are formed for sealing the mounted LSI chip 2, the layers 4 and 5 being integrated by resin layers M in the vias 61a to 61d. It is preferable that these layers 4 and 5 have substantially the same size and thickness.

Also with this embodiment, similar effects as the first embodiment can be obtained. In this embodiment, if the thickness of the mother board 1 is the same as, or greater than, that of the chip 2, the surface of the mounted LSI chip 2 is flush with, or lower than, the front surface of the mother board 1. Therefore, the front surface sealing resin layer 4 as well as the rear surface sealing resin layer 5 can be made thinner than the first embodiment, and the total thickness of the device can be made small.

Figure 4A:
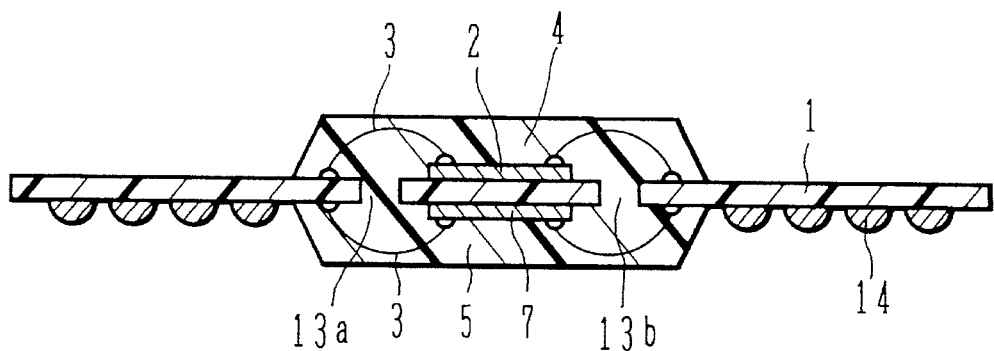
FIG. 4A is a cross sectional view of a semiconductor device according to still another embodiment of the invention.
Figure 4B:
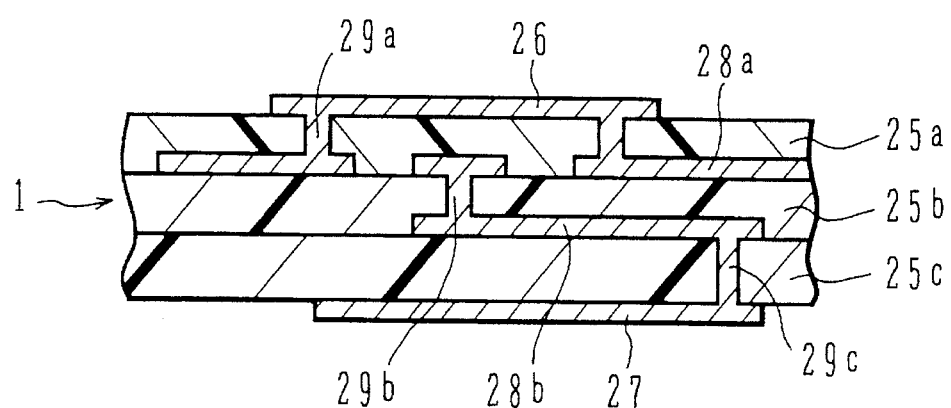
FIG. 4B is a schematic cross sectional view showing the structure of a multi-layer circuit board.

FIGS. 4A and 4B illustrate still another embodiment of the invention. In this embodiment, LSI chips 2 and 7 are mounted respectively on the front and rear surfaces of a mother board 1. A front surface sealing resin layer 4 and a rear surface sealing resin layer 5 are formed for sealing the LSI chips 2 and 7. In this embodiment, it is necessary for the mother board 1 to have wiring patterns for the LSI chips 2 and 7. It is therefore preferable to use a mother board 1 of a multi-layer structure such as shown in FIG. 4B. This mother board 1 includes three-layer insulating sheets 25a, 25b, and 25c, interlevel wiring patterns 28a and 28b, front surface wiring patterns 26, rear surface wiring patterns 27, and wiring layers 29a, 29b, and 29c in via holes. In this embodiment, since the symmetry of the front and rear surface sides is improved, reliability is further ensured.

Figure 5:
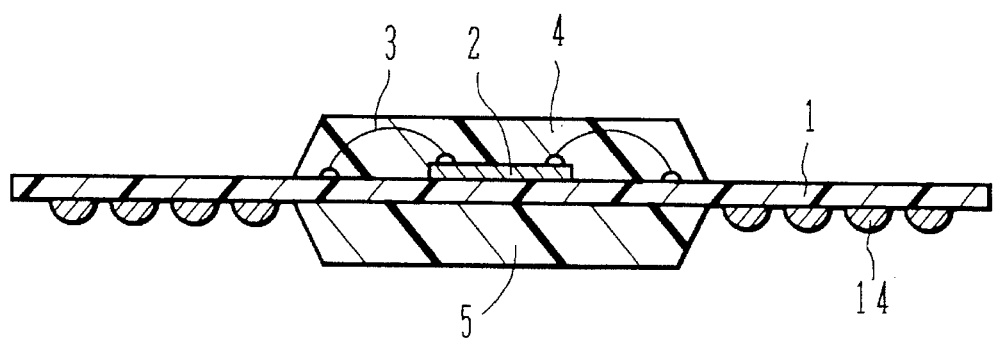
FIG. 5 is a cross sectional view of a semiconductor device according to a further embodiment of the invention.

FIG. 5 illustrates still another embodiment of the invention. In this embodiment, vias for communicating molding resin are not formed in a mother board near at the LSI chip mount area as in the other embodiments. The other points are similar to the first embodiment shown in FIG. 1. Although a front surface sealing resin layer 4 and a rear surface sealing resin layer 5 are not directly integrated and the device is somewhat mechanically weak as compared to the other embodiments, the effects of preventing a warp of a board and a permeation of moisture content can be ensured sufficiently.

Next, examples of solder-mounting the semiconductor device of this invention will be described with reference to FIGS. 6 to 8.

Figure 6:
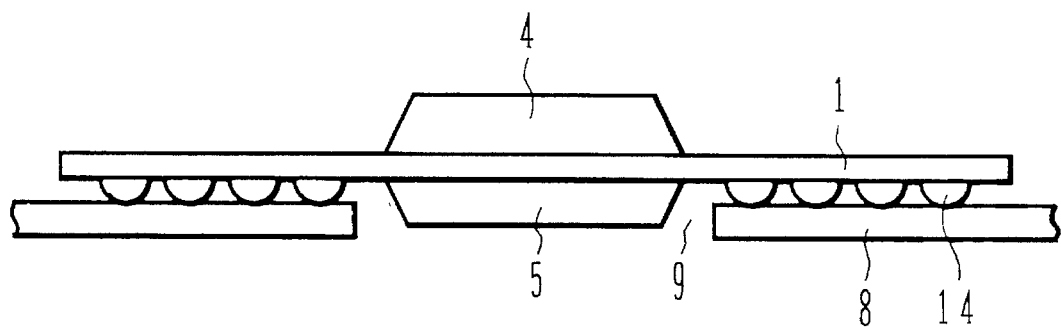
FIG. 6 is a schematic diagram showing an example of mounting a semiconductor device of this invention.

FIG. 6 illustrates an example of solder-mounting by using a mounting board 8 with a molded LSI chip mount hole 9 previously formed therein. A rear surface sealing resin layer 5 is inserted into this hole 9. Since the bottoms of the mounting board 8 and rear surface sealing resin layer 5 are made less uneven, there is no burden for assembling this device with another components.

Figure 7:
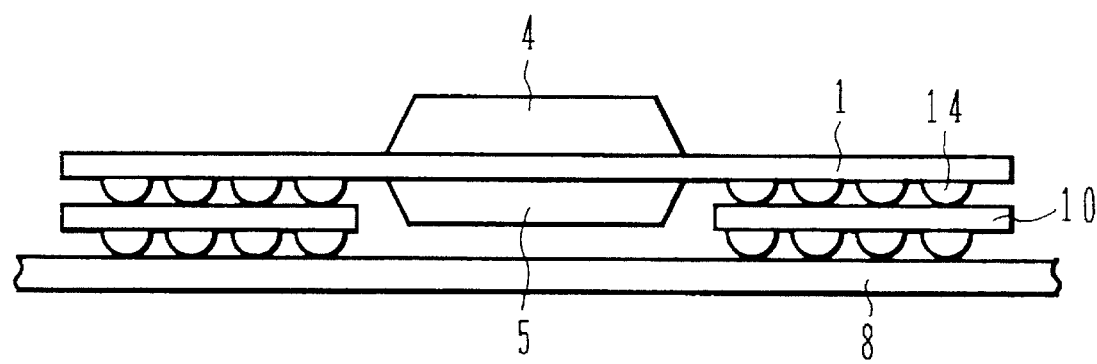
FIG. 7 is a schematic diagram showing another example of mounting a semiconductor device of this invention.

FIG. 7 illustrates an example of solder-mounting by using an intermediate mounting board 10 without forming a hole in a base mounting board 8. Solder balls 14 on the rear surface of a mother board 1 are connected to the intermediate mounting board 10.

Figure 8:
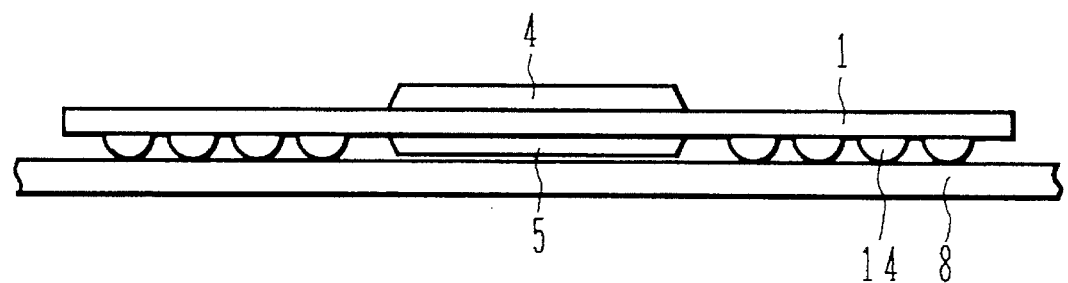
FIG. 8 is a schematic diagram showing still another example of mounting a semiconductor device of this invention.

FIG. 8 illustrates an example of solder-mounting without forming the LSI chip mount hole 9 in the mounting board 8 such as shown in FIG. 6, and without using the intermediate mounting board 10 such as shown in FIG. 7. This mounting is possible if the thickness of a rear surface sealing resin layer 5 is less than that of the solder balls 14, for example, as in the embodiment shown in FIG. 5 where the rear surface sealing resin layer 5 is made sufficiently thin.

The present invention has been described in connection with the preferred embodiments. The invention is not limited only to the above embodiments. It is apparent to those skilled in the art that various modifications, substitutions, combinations and the like can be made without departing from the scope of the appended claims.

I claim:

1. A semiconductor device comprising:

a board with a plurality of wiring patterns:

an LSI chip mounted on a front surface of the board at a mounting area thereof;

a front surface sealing resin layer for sealing the LSI chip mounted on the front surface of the board; and a rear surface sealing resin layer for sealing a rear surface of the board at a position registered to the front surface sealing resin layer, the rear surface sealing resin layer having substantially the same size and thickness as those of the front surface sealing resin layer;

through holes formed in the board at a peripheral area thereof, the plurality of wiring patters extending from the front surface to the rear surface via the through holes; and solder balls formed on the wiring patterns formed on the rear surface of the board, the solder balls being formed at an outside area of the rear surface sealing resin layer.

2. A semiconductor device according to claim 1, wherein the wiring patterns are formed on the board at an area outward from the vias.

3. A semiconductor device according to claim 2, further comprising bonding wires for electrical connection between the LSI chip and ends of the wiring patterns on the front surface, the front surface sealing resin layer sealing the bonding wires.

4. A semiconductor device according to claim 1, wherein the plurality of wiring patterns continuously extend from the Front surface to the rear surface of the board via the through holes.

5. A semiconductor device according to claim 4, wherein the board is a multi-layer board.

6. A semiconductor device according to claim 5, further comprising another LSI chip mounted on the rear surface of the board.

7. A semiconductor device according to claim 1, wherein the board and the LSI chip are rectangular, and the vias are four elongated slit holes formed along sides of the LSI chip.

8. A semiconductor device according to claim 7, wherein the wiring patterns include four sets of wiring patterns, each set being formed on the board at an area outward from the vias and inward from a corresponding side of the board.

9. A semiconductor device comprising:

a board with a plurality of wiring patterns, the board having an LSI chip mount hole;

a heat sink disposed on a rear surface of the board and closing the LSI chip mount hole, the heat sink having a mount area for an LSI chip;

an LSI chip mounted on the heat sink in the LSI chip mount hole of the board, the LSI chip being mounted on the heat sink at the mount area thereof;

a front surface sealing resin layer for sealing the LSI chip mounted the heat sink and a front surface of the board;

a rear surface sealing resin layer for sealing the rear surface of the board at an area where the heat sink is disposed;

vias formed in the heat sink near the mount area for the LSI chip, the front surface sealing resin layer and the rear surface sealing resin layer being integrated through the vias;

through holes formed in the board at the peripheral area thereof, the plurality of wiring patters extending from the front surface to the rear surface via the through holes; and solder balls formed on the wiring patterns formed on the rear surface of the board, the solder balls being formed at an outside area of the rear surface sealing resin layer.

10. A semiconductor device according to claim 9, wherein the heat sink is adhered to the board.

11. A semiconductor device according to claim 9, further comprising bonding wires for electrical connection between the LSI chip and ends of the wiring patterns on the front surface, the front surface sealing resin layer sealing the bonding wires.

12. A semiconductor device according to claim 9, wherein the plurality of wiring patterns continuously extend from the front surface to the rear surface of the board via the through holes.

13. A semiconductor device according to claim 12, wherein the board is a multi-layer board.

14. A semiconductor device according to claim 13, further comprising another LSI chip mounted on the rear surface of the board.

15. A semiconductor device according to claim 9, wherein the board, the LSI chip mount hole, and the LSI chip, are rectangular, and the vias are four elongated slit holes formed along the sides of the LSI chip.

16. A semiconductor device according to claim 9, wherein the LSI chip has a thickness same as, or smaller than, a thickness of the board.

* * * * *